United States Patent [19]
Shu et al.

[11] Patent Number: 6,151,103
[45] Date of Patent: Nov. 21, 2000

[54] METHOD AND SYSTEM FOR IMPROVED OPTICAL IMAGING IN MICROLITHOGRAPHY

[75] Inventors: Jing-Shing Shu, Richardson, Tex.; Anthony Yen, Plantation, Fla.

[73] Assignee: Texas Instruments Incorporated, Dallas, Tex.

[21] Appl. No.: 09/281,530

[22] Filed: Mar. 30, 1999

Related U.S. Application Data

[62] Division of application No. 08/852,508, May 7, 1997, abandoned.
[60] Provisional application No. 60/017,858, May 8, 1996.

[51] Int. Cl.[7] .......................... G03B 27/42; G03B 27/72; G02B 27/42
[52] U.S. Cl. .............................. 355/71; 355/53; 359/562; 359/564; 430/3
[58] Field of Search .................................. 355/67, 71, 53, 355/52; 430/5, 322; 359/885, 889, 559, 560, 562, 564

[56] References Cited

U.S. PATENT DOCUMENTS

| | | | |
|---|---|---|---|
| 3,598,471 | 8/1971 | Baldwin et al. | 350/162 |
| 3,860,424 | 1/1975 | Johnson | 96/38.4 |
| 5,055,871 | 10/1991 | Pasch | 355/53 |
| 5,144,362 | 9/1992 | Kamon et al. | 355/53 |
| 5,316,896 | 5/1994 | Fukuda et al. | 430/322 |
| 5,481,332 | 1/1996 | Shiraishi | 355/53 |
| 5,552,856 | 9/1996 | Shiraishi et al. | 355/53 |
| 5,621,500 | 4/1997 | Shiraishi | 355/71 |
| 5,642,183 | 6/1997 | Sugihara et al. | 355/71 |
| 5,677,757 | 10/1997 | Taniguchi et al. | 355/71 |

FOREIGN PATENT DOCUMENTS

| | | | |
|---|---|---|---|
| 0 496 891 A1 | 8/1991 | European Pat. Off. | H01L 21/027 |
| 0 485 062 A2 | 9/1991 | European Pat. Off. | G03B 27/52 |
| 44 30 253 A1 | 8/1994 | Germany | G03F 7/20 |

*Primary Examiner*—Alan A. Mathews
*Attorney, Agent, or Firm*—Mark A. Valetti; Wade James Brady, III; Frederick J. Telecky, Jr.

[57] ABSTRACT

An improved microlithographic imaging system (100) is disclosed. The system comprises a filter (183) substantially aligned with a first image plane, adjacent to an aperture (185). The filter is formed in response to an image projected by a light source (110) through a reticle (160) onto the first image plane. The improved microlithographic imaging system has higher resolution and depth of focus than prior art imaging systems, due to the additional filtering performed by the filter (183). A filter in accordance with the invention can be fabricated easily and inexpensively, using conventional microlithography techniques. A filter in accordance with the invention can also be used to detect or correct flaws in the reticle (160).

17 Claims, 3 Drawing Sheets

METHOD AND SYSTEM FOR IMPROVED OPTICAL IMAGING IN MICROLITHOGRAPHY

This application is a divisional of application Ser. No. 08/852,508 filed May 7, 1997, now abandoned, which claims priority under 35 USC § 119(e)(1) from provisional application No. 60/017,858 filed May 8, 1996, now abandoned.

BACKGROUND OF THE INVENTION

The use of photosensitive etch-resistant materials in microlithography is well known. Generally, as part of the process of fabricating an integrated circuit or other microelectronic devices, a layer of such material, known as a photoresist, is deposited onto a silicon wafer or other material which is to be selectively etched. The photoresist layer is then exposed to an image or pattern of light, which chemically alters the areas exposed to light.

If the photoresist is of the type known as a positive photoresist, then the areas of the photoresist exposed to light can be dissolved or washed away with a developer. With a negative photoresist, the areas not exposed to light are removed by the developer. In either case, the developer is typically a liquid aqueous or organic solution. However, for certain types of photoresists known as dry developed resists, plasma etching may be used to remove the selected parts of the photoresist layer.

After part of the photoresist layer has been removed, the wafer may be immersed in or subjected to an etchant, which removes the exposed areas of the wafer underlying the photoresist. Thus, the light pattern previously projected onto the photoresist is etched into the wafer. The remaining photoresist may then be removed with the use of a suitable solvent. This series of steps is one of the basic processes used in the fabrication of integrated circuits.

A variety of methods can be used to project an image or pattern of light onto the photoresist layer. One such method is to place a mask bearing the desired pattern directly onto the photoresist layer and then expose the mask and wafer to light. In this case, the mask must be of the same size as the image desired on the photoresist layer.

Another method is to project light from a light source through a mask-like object known as a reticle. The reticle typically comprises a transparent layer partially covered by an opaque layer, the opaque layer being a negative image of the circuit or pattern to be etched into the silicon wafer. The light which passes through the reticle is projected through a series of lenses onto the photoresist layer. Using this method, a reticle which bears a pattern several times larger than the pattern to be projected onto the photoresist layer can be used. Typical ratios between reticle size and projected image size in common use are 2, 2.5, 4, and 5.

Since many identical integrated circuits are typically created on a single silicon wafer, a reticle bearing one, two or four identical integrated circuit patterns is typically projected in a series of exposures onto different regions of a single photoresist layer. A system for accomplishing multiple exposures, known as a stepper, has a movable stage for holding and automatically positioning the silicon wafer in a plane perpendicular to the axis along which the image is being projected. The stepper automatically moves the silicon wafer between exposures so that an array of images is successively projected onto the surface of the silicon wafer.

Another type of exposure tool, known as a scanner, uses a reticle and an optical arrangement similar to a stepper. However, while a stepper uses a distributed light source to expose the entire reticle pattern simultaneously, a scanner uses a thin beam or arc of light which is moved ("scanned") across the surface of the reticle. The beam of light is only wide enough to cover a portion of the reticle. Thus, the light beam must be scanned across the reticle in a regular fashion to expose all the surface area of the reticle. The light beam projects the reticle pattern segment-by-segment onto the wafer, so that eventually the entire reticle image is projected onto the wafer.

Two of the critical parameters of a stepper, scanner, or like projection system are its resolution and depth of focus. The resolution of the system determines the minimum size of the lines or structures which may be accurately projected onto the wafer. The depth of focus determines the amount of "flatness" required for the photoresist layer, or the variation in the distance between the image projection optics and the photoresist layer which can be tolerated without losing the focus of the image at the photoresist layer.

Because of the demand for ever-smaller integrated circuits, high resolution projection systems have become increasingly desirable. In addition, a large depth of focus is desired to accommodate the topography of features underneath the photoresist. However, improvements to resolution will usually result in degradation of the depth of focus, and vice versa. Thus, a method and/or device which improves both resolution and depth of focus in a projection system is desirable.

One known method for improving image quality in a stepper system is to employ a special type of reticle known as a phase-shifting reticle or phase-shifting mask. A phase-shifting reticle has selected transparent areas which are different from the other transparent areas of the reticle. Light passing through the selected areas is shifted in phase by a predetermined amount (e.g. 180°) relative to light passing through the other transparent areas of the reticle. This arrangement significantly reduces the "zeroth-order" or diffused background light which reaches the photoresist layer. As a result, the image projected onto the photoresist layer is clearer and sharper, having better resolution and depth of focus than an image projected using a non-phase-shifting reticle. To further improve the resolution and depth of focus of microlithographic imaging systems, a method or system which further reduces the zeroth-order light in the image is desirable.

In addition, a reticle will sometimes contain flaws or imperfections in its pattern which, if left uncorrected, will result in a flawed pattern being etched into the wafer. Therefore, a method or system which detects or corrects flaws in the reticle of a microlithographic imaging system is desirable.

SUMMARY OF THE INVENTION

Accordingly, an optical filter which can be used to achieve these objectives is disclosed. The optical filter is formed in response to an image projected by a light source through a reticle. A technical advantage of a filter in accordance with the invention is that a filter formed using one reticle can be used in conjunction with another filter formed using another reticle to detect flaws in one of the reticles.

A method for fabricating a filter in accordance with the invention is disclosed. The method comprises the steps of exposing a photosensitive plate to an image projected by a light source through a reticle, and creating the optical filter from the photosensitive plate in response to the photosensitive plate being exposed to the image. A technical advantage of the method in accordance with the present invention is that a filter may be created to correspond to any reticle. Another advantage is that a filter in accordance with the invention can be fabricated easily and inexpensively, using conventional microlithography techniques.

In accordance with the invention, an imaging system is disclosed. The system comprises a reticle and a filter substantially parallel to and aligned with a first image plane. The filter is formed in response to an image projected by a light source through the reticle onto the first image plane. A technical advantage in an imaging system in accordance with the present invention is that the filter may be altered to provide improved resolution and depth of focus for the imaging system. Another advantage is that the filter may be altered to provide correction for flaws in the reticle.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
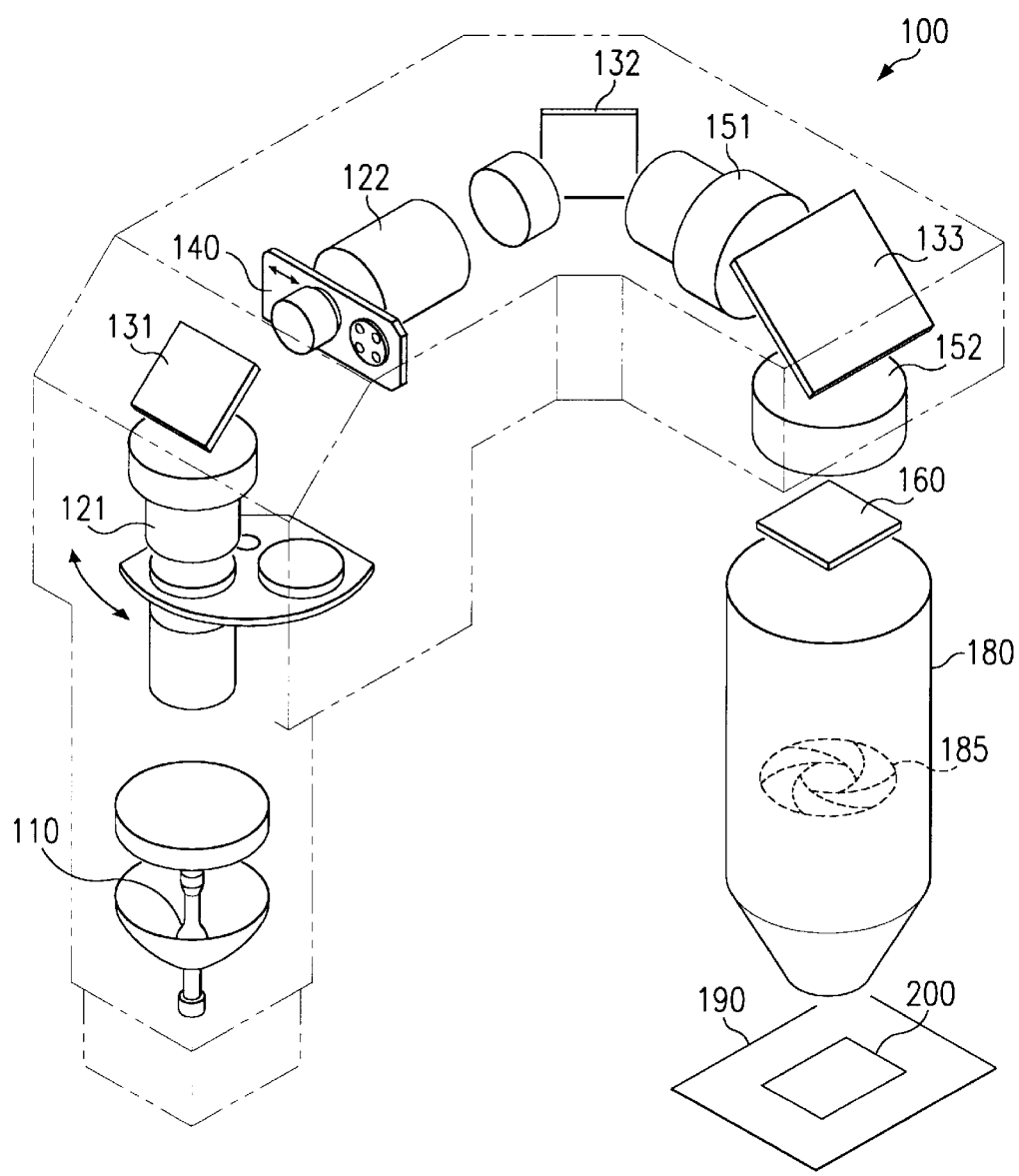
FIG. 1 is a simplified perspective view of a stepper system including a filter in accordance with the invention.
Figure 2:
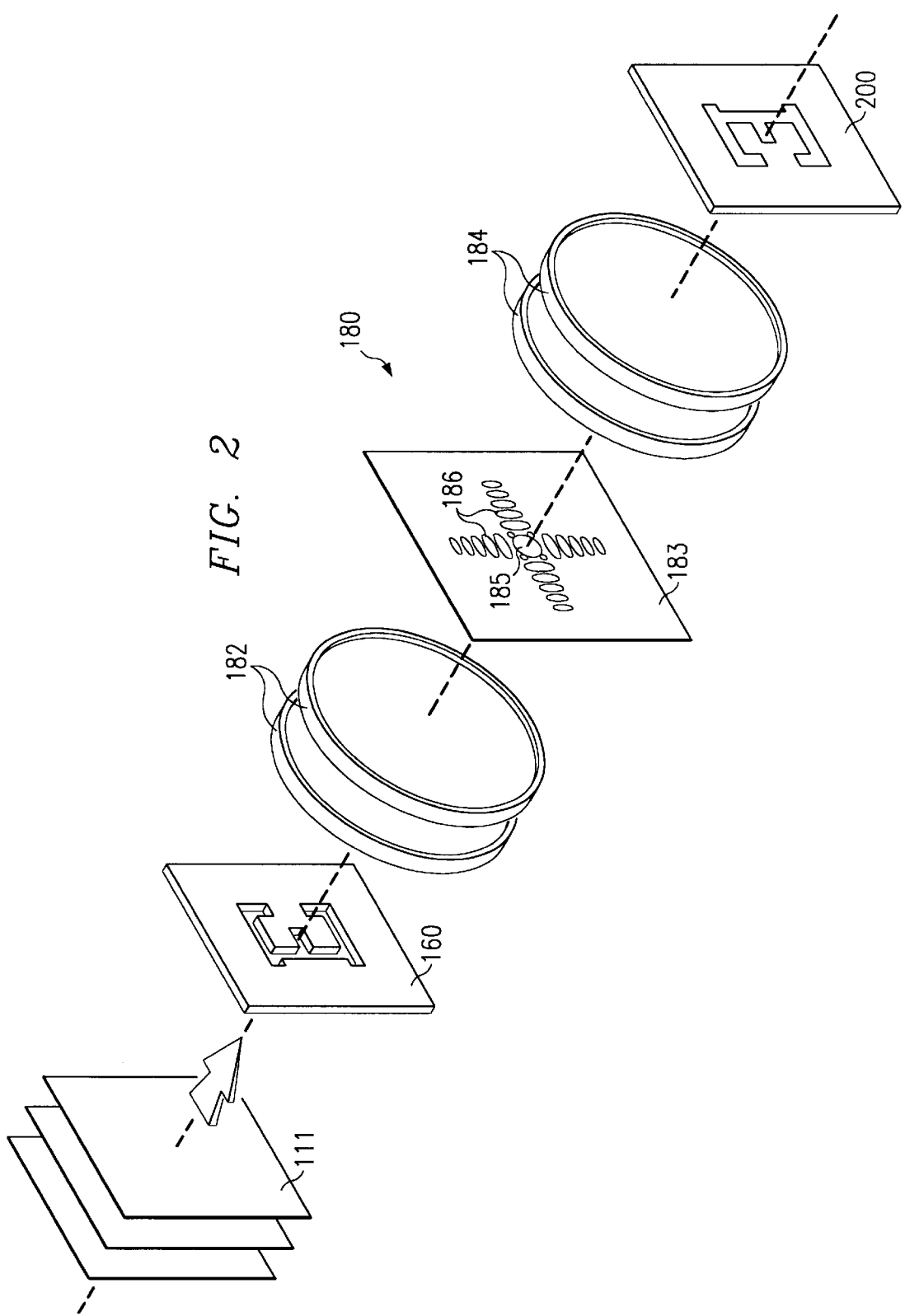
FIG. 2 is an exploded view of a portion of the stepper system in accordance with the teaching of the present invention.

The preferred embodiment of the present invention and its advantages are best understood by referring to FIGS. 1 through 3 of the drawings, like numerals being used for like and corresponding parts of the various drawings.

Referring to FIG. 1, a microlithographic stepper system in accordance with the invention is shown. The stepper system 100 operates to project an image onto a wafer 200. The stepper system 100 has a light source 110, which may be a mercury lamp or the like. Light source 110 projects light vertically upward. The light is reflected through three 90° angles by three mirrors 131, 132 and 133, after which the light is projected downward toward a reticle 160. The distribution of light from the light source 110 is controlled by two light source distribution controllers 121 and 122, which are similar to zoom lenses. An aperture 140 and masks 151 and 152 control the amount of light which reaches reticle 160.

Reticle 160 comprises a transparent material such as glass, with darkened or opaque areas outlining a pattern which is to be etched onto the wafer 200. The pattern of transparent and opaque areas on reticle 160 is several times the size of the pattern to be etched onto wafer 200. Reticle 160 may be a phase-shifting reticle as previously described.

A column 180 is situated between reticle 160 and wafer 200, and contains a plurality of lenses (not shown). These lenses serve to focus the reticle image down to the size of the pattern which is to be etched into wafer 200. These lenses also serve to correct for aberrations such as chromatic and spherical aberration. Column 180 also contains an iris-type aperture 185, which occupies a first image plane known as the pupil plane. Aperture 185 can be adjusted to let a desired amount of light pass into the lower part of column 180. Typically, there are several lenses above and below aperture 185 in column 180.

Light which emerges from column 180 is projected onto a second image plane occupied by wafer 200, which is typically coated with a photoresist layer. Wafer 200 is positioned by a movable stage 190. Stage 190 automatically moves wafer 200 through a series of positions within the second image plane so that a series of identical images are projected onto various portions of wafer 200.

Referring to FIG. 2, a more detailed drawing of the contents of column 180 is shown. Column 180 contains a first series of lenses 182, a filter 183 constructed in accordance with the teachings of the present invention, and a second series of lenses 184. While only two lenses are shown in each series 182 and 184 to avoid cluttering the diagram, it is understood that each series typically contains ten to twenty lenses for image focusing and correction.

In operation, light projected by light source 110 is focused, reflected, and filtered by the various elements of stepper system 100 as described above, so that parallel light waves 111 impinge upon reticle 160. For exemplary purposes, the pattern of light transmitted by reticle 160 is in the shape of a block letter E. However, it is understood that in normal operation, the pattern on reticle 160 is the pattern which is to be etched onto wafer 200.

Also, for illustrative purposes, it will be assumed that the first and second series of lenses 182 and 184 can each be approximated by a single convex lens, with the focal lengths of both series 182 and 184 being equal. The distance from reticle 160 to lens series 182 is one focal length, as is the distance from lens series 182 to filter 183, which is placed in the pupil plane. Likewise, filter 183, lens series 184, and the second image plane occupied by wafer 200 are each one focal length apart. As a result, the image of reticle 160 at the second image plane is an inversion of the reticle pattern, in this case an inverted E.

The image of reticle 160 at the first image plane, in this case the pupil plane, where filter 183 is located, is a Fourier transform of the reticle pattern. The nature of Fourier transforms is such that the image of reticle 160 at the first image plane typically comprises a central region 185 where the light is most intense. Central region 185 corresponds to the zeroth order of the Fourier transform. A plurality of smaller, less intense areas 186 corresponds to the higher orders of the Fourier transformer.

It is understood that other optical arrangements, well known in the art, may be utilized to create an image at wafer 200 which is scaled down by a predetermined factor from the size of the reticle pattern. Furthermore, it is understood that such arrangements may include various placements of filter 183 with respect to series 182 and 184 and with respect to the pupil plane, resulting in various reticle images at filter 183.

Figure 3A:
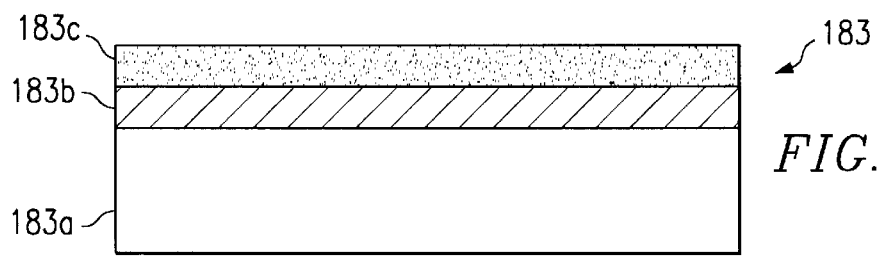
FIGS. 3A–3E are cross-sectional views of a filter in various stages of fabrication in accordance with the invention.

The fabrication of filter 183 in accordance with the teachings of the present invention is illustrated in FIGS. 3A–3E. This process is much like the process used to manufacture a typical reticle or mask. Referring to FIG. 3A, a wafer of transparent glass or quartz 183a is successively coated with an opaque layer 183b and a photoresist layer 183c. Opaque layer 183b may for example be made of chrome or chrome oxide, in which case layer 183b will completely or almost completely block and/or reflect any light rays which impinge upon it. Alternatively, layer 183b may be made or some other material which is completely or partially opaque. The material, if only partially opaque, may also cause a change of phase in the light waves which pass through layer 183b. The coated glass shown in FIG. 3A is filter 183 in an undeveloped state.

Figure 3B:
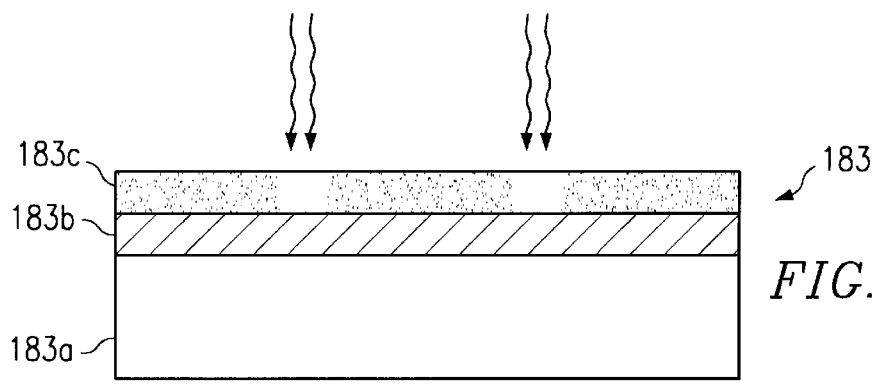

Filter 183 is placed in the first image plane, in this case the pupil plane defined by aperture 185 in column 180, with photoresist layer 183c facing lenses 182 and reticle 160. When light source 110 is activated, an image from reticle 160 will be projected onto filter 183, as shown in FIG. 3B. As previously described, the pattern of light projected onto filter 183 is typically a Fourier transform of the pattern on reticle 160.

Figure 3C:
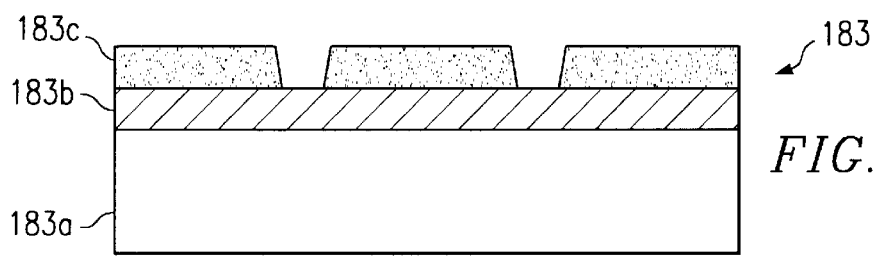

After a sufficient exposure time, filter 183 is removed from column 180 and chemically processed in the same manner as a typical reticle or mask. First, referring to FIG. 3C, the areas of photoresist 183c which have been exposed to light are removed (the filter is "developed") using methods well known in the art of microlithography. If photoresist layer 183c comprises a positive photoresist, then the developing step will leave gaps or holes in layer 183c, as shown in FIG. 3C, the gaps corresponding to areas exposed to light from the image. Typically, this step will leave a gap in a large central area 185 corresponding to the zeroth order of the Fourier transform of the reticle pattern, as shown in FIG. 2, with a plurality of smaller gaps 186 corresponding to the higher orders of the Fourier transform.

If photoresist layer 183c comprises a negative photoresist, then the developing step will result in layer 183c being the opposite of that shown in FIG. 3C. Thus, the developer will remove any portion of layer 183c not exposed to light, leaving only the areas corresponding to the gaps shown in FIG. 3C.

Photoresist layer 183c is preferably a positive photoresist, and this embodiment of the invention will be described first. However, an alternative embodiment of the present invention, in which layer 183c comprises a negative photoresist, is described below.

Figure 3D:
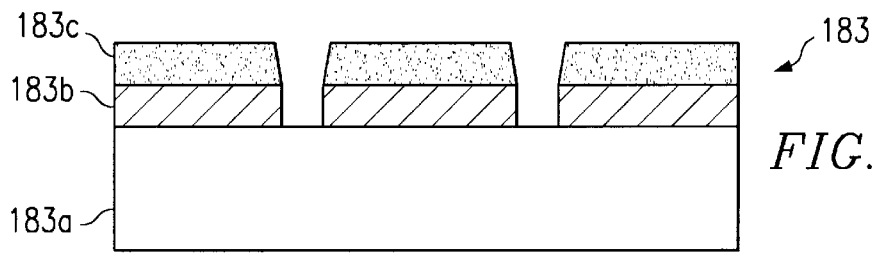
Figure 3E:
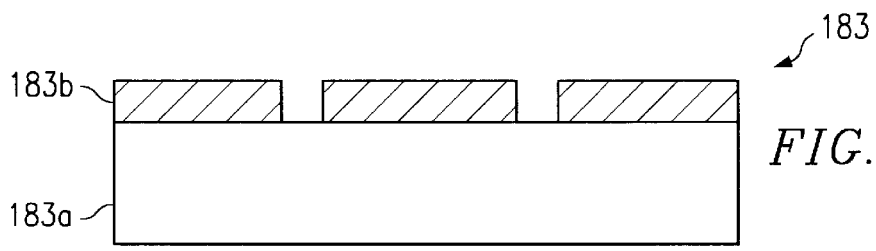

Next, referring to FIG. 3D, filter 183 is exposed to an etchant, which removes chrome layer 183b in the areas not covered by photoresist 183c. After etching, the remaining photoresist layer 183c can be removed, as shown in FIG. 3E, although this step is not necessary. At the end of this process, filter 183 comprises a transparent glass layer 183a which allows light to pass, with light being blocked in selected areas by the opaque chrome layer 183b.

While the process shown in FIGS. 3A–3E is the preferred method of fabrication for filter 183, a filter can be fabricated without a chrome layer or other opaque layer 183b underneath photoresist 183c. Instead, the photoresist layer 183c can be deposited directly onto the glass layer 183a. The photoresist layer 183c can then be exposed and developed as shown in FIGS. 3B and 3C. At this point, the photoresist layer 183c can be rendered opaque or partially opaque by "baking" the photoresist using a process well known in the art. The result is a filter similar to that shown in FIG. 3E, but with the opaque photoresist layer 183c taking the place of the chrome layer 183b.

The process described above results in a filter 183 which bears a Fourier transform of the reticle pattern. Such a filter has several possible uses. For example, if filter 183 is manufactured with the use of a reticle 160 which is known to be free of mistakes or flaws, then filter 183 may be used in conjunction with other reticles which are intended to be identical to reticle 160, but which may contain imperfections or flaws. When light passing through a new reticle is also filtered by filter 183, image distortions due to flaws in the reticle pattern may be at least partially corrected by filter 183.

Another possible use for such a filter is in the detection of flaws in the reticle 160. For example, if reticle 160 bears four identical patterns in a square array, all but one of the patterns can be blocked off so as to allow the image of only one of the patterns to pass through column 180. In this manner, a special filter which bears the Fourier transform of only the selected pattern can be created, using the steps outlined above. By selecting the three other patterns on the reticle in turn, a series of four such filters could be created. The features of these filters could then be compared, for example by superimposing one filter over another. In this manner, discrepancies between the filters, indicating flaws in one or more of the reticle patterns, could be identified.

Yet another use for filter 183 is to improve the resolution and depth of focus of stepper system 100. As noted above with respect to phase-shifting reticles, the reduction of zeroth-order or diffused background light significantly improves the resolution and depth of focus of the projected image. Because of the nature of Fourier transformations, the zeroth-order light from reticle 160, as seen at filter 183, forms a bright area 185 concentrated near the projection axis, and therefore near the center of filter 183. As a result, image quality can be enhanced by reducing the intensity of light transmitted through the center of filter 183 relative to the intensity of light transmitted through other areas 186 of filter 183.

This selective filtering requires enhancement of filter 183. Filter 183 can be enhanced by darkening the central region 185 of filter 183 using any suitable means. For example, referring to FIG. 3E, a negative photoresist layer (not shown) is deposited over the chrome layer 183b. Filter 183 is then re-inserted into stepper system 100 in the pupil plane, with the negative photoresist layer facing reticle 160. The negative photoresist layer is exposed briefly to the image projected by light source 110 through reticle 160. The result of this brief exposure is that, when filter 183 is removed from stepper 100 and developed, the negative photoresist layer remains thickest at the region of highest exposure to light, in this case near the center of filter 183. The filter is then baked to render the negative photoresist layer at least partially opaque. The most opaque region of the negative photoresist layer is the thickest region, which is region 185 nearest the center of filter 183 as shown in FIG. 2.

An alternative method for darkening the central region 185 of filter 183 can be used. A negative photoresist layer is first deposited on filter 183 as described above. Next, filter 183 is re-inserted into stepper 100 in the pupil plane. However, filter 183 is inserted upside down, with the transparent layer 183a facing series 182 of lenses. Filter 183 is then exposed to light from light source 110.

Using this method, reticle 160 need not be present in stepper 100 during the exposure of filter 183. Indeed, this exposure could be performed using any suitable light source, without the need for the complicated arrangement of stepper 100. The only requirement for this exposure step is that the light which reaches filter 183 must be more intense near the center of filter 183 than the light received near the edges.

Because chrome layer 183b is opaque, no light reaches the regions of the negative photoresist layer overlying chrome layer 183b. Only those regions where chrome layer 183b has previously been removed are exposed to light, with the most intense exposure being near the center of filter 183. Filter 183 is then removed and the negative photoresist layer is developed and baked as previously described to render the photoresist layer opaque. The final result is that the negative photoresist layer will be most opaque where it is thickest, i.e. nearest the center.

Yet another alternative method for enhancing filter 183 is to "lighten," or increase the transparency of, the transparent areas outside central region 185, rather than (or in addition to) darkening the central region 185 as previously described. The transparency or transmission coefficient of the transparent areas 186 outside central region 185 can be increased by etching away the surface of transparent layer 183a in the selected areas 186. Reducing the amount of material which light must traverse to pass through the selected areas 186 will reduce the absorption of light in these areas, thus increasing the intensity of the higher orders of the Fourier transform transmitted by filter 183 relative to the zeroth order.

Yet another alternative method for enhancing filter 183 is to etch away opaque layer 183b around the perimeters of the transparent areas 186 outside central region 185. This will not increase the light transmitted through the higher order transparent areas 186 if reticle 160 and filter 183 are perfectly aligned. However, if reticle 160 and filter 183 are imperfectly aligned, whether deliberately or by accident, the increased size of the higher order transparent areas 186 will cause the normal amount of light to be transmitted through these areas, while the amount of light transmitted through the zeroth-order central region 185 will be reduced due to the misalignment. This once again reduces the zeroth-order intensity relative to the higher orders.

All of the above-described methods of fabrication for filter 183 have required that photoresist layer 183c be a positive photoresist. In an alternative embodiment of filter 183, layer 183c comprises a negative photoresist. In this embodiment, layer 183c is deposited directly onto transparent layer 183a. Filter 183 is then inserted into stepper 100 in the pupil plane and briefly exposed to the reticle image. The duration of the exposure is such a that, when filter 183 is developed, only the most intensely exposed region, region 185 near the center of filter 183, retains any significant amount or thickness of the negative photoresist layer 183c. The negative photoresist is then rendered opaque by means of baking filter 183, as previously described with respect to other embodiments of the invention. As a result, filter 183 comprises a partially opaque disk in region 185 near the center of filter 183, with the areas outside region 185 being entirely or almost entirely transparent. The partially opaque region 185 serves to reduce transmission of zeroth order of the Fourier transform of the reticle image relative to the higher orders of the transform.

When fabrication of filter 183 in accordance with any one of the embodiments of the present invention is complete, filter 183 may be utilized to improve the resolution and depth of focus of stepper system 100. First, filter 183 is reinserted into column 180 in the first image plane, in this case the pupil plane adjacent to aperture 185. Then, light source 110 is activated to project an image of reticle 160 onto wafer 200. When filter 183 is used in conjunction with its corresponding reticle 160, filter 183 reduces the zeroth-order light which reaches wafer 200 relative to the higher orders, thus improving the resolution and depth of focus of the image projected by light source 110 onto wafer 200.

It is understood that stepper system 100 could instead be a projection scanner system. In that case, light source 110 comprises a movable light source mechanism for projecting a thin arc of light onto reticle 160. The movable light source mechanism 110 automatically sweeps or scans the projected arc of light across reticle 160 so as to project the image of reticle 160 in its entirety onto wafer 200 after one complete scan. Movable light source mechanism 110 preferably comprises a stationary mercury lamp masked by a movable slit. The movable slit, which allows only a thin arc of light to be projected onto reticle 160, is automatically moved at a constant rate to scan the thin arc of light across reticle 160. Movable light source mechanism 110 can be used both for the initial exposure of filter 183 during fabrication, and for projecting the image of reticle 160 through filter 183 onto wafer 200.

While the invention has been particularly shown and described by the foregoing detailed description, it will be understood by those skilled in the art that various other changes in form and detail may be made without departing from the spirit and scope of the invention.

What is claimed is:

1. An imaging system comprising:
   a reticle comprising a first pattern of transparent areas;
   a first image plane; and
   a filter substantially parallel to and aligned with said first image plane comprising a second pattern of transparent areas having a selectively altered Fourier transform of the first pattern.

2. The system of claim 1 further comprising a plurality of lenses, wherein the first image plane is located between a selected two of the plurality of lenses.

3. The system of claim 1 wherein the filter comprises a transparent layer and an opaque layer, the opaque layer covering selected portions of the transparent layer in response to the image projected by the light source through the reticle onto the first image plane.

4. The system of claim 1 wherein the reticle is a phase-shifting reticle.

5. The system of claim 1 further comprising a movable stage for positioning a wafer, wherein the filter is located between the reticle and the movable stage.

6. The system of claim 1 further comprising a movable light source mechanism for projecting light through a selected portion of the reticle.

7. The system of claim 1 wherein the selective alteration of said pattern is an increase in the intensity of the higher orders of the Fourier transform transmitted by said filter relative to the zeroth order of the unaltered Fourier transform.

8. The system of claim 2 wherein the selective alteration of said pattern is an increase in the intensity of the higher orders of the Fourier transform transmitted by said filter relative to the zeroth order of the unaltered Fourier transform.

9. The system of claim 3 wherein the selective alteration of said pattern is an increase in the intensity of the higher orders of the Fourier transform transmitted by said filter relative to the zeroth order of the unaltered Fourier transform.

10. The system of claim 4 wherein the selective alteration of said pattern is an increase in the intensity of the higher orders of the Fourier transform transmitted by said filter relative to the zeroth order of the unaltered Fourier transform.

11. The system of claim 5 wherein the selective alteration of said pattern is an increase in the intensity of the higher orders of the Fourier transform transmitted by said filter relative to the zeroth order of the unaltered Fourier transform.

12. The system of claim 1 wherein the selective alteration of said pattern is a decrease in the intensity of the zeroth order of the unaltered Fourier transform relative to the higher orders of the Fourier transform.

13. The system of claim 2 wherein the selective alteration of said pattern is a decrease in the intensity of the zeroth order of the unaltered Fourier transform relative to the higher orders of the Fourier transform.

14. The system of claim 3 wherein the selective alteration of said pattern is a decrease in the intensity of the zeroth order of the unaltered Fourier transform relative to the higher orders of the Fourier transform.

15. The system of claim 4 wherein the selective alteration of said pattern is a decrease in the intensity of the zeroth order of the unaltered Fourier transform relative to the higher orders of the Fourier transform.

16. The system of claim 5 wherein the selective alteration of said pattern is a decrease in the intensity of the zeroth order of the unaltered Fourier transform relative to the higher orders of the Fourier transform.

17. The system of claim 6 wherein the selective alteration of said pattern is a decrease in the intensity of the zeroth order of the unaltered Fourier transform relative to the higher orders of the Fourier transform.

* * * * *